United States Patent
Bicker et al.

(10) Patent No.: US 10,525,655 B2
(45) Date of Patent: Jan. 7, 2020

(54) COMPOSITE MATERIAL FOR A PHARMACEUTICAL PACKAGING, METHOD FOR THE PRODUCTION THEREOF, AND USE OF THE COMPOSITE MATERIAL

(71) Applicant: SCHOTT AG, Mainz (DE)

(72) Inventors: Matthias Bicker, Mainz (DE); Manfred Lohmeyer, Nackenheim (DE); Tanja Woywod, Mainz (DE)

(73) Assignee: SCHOTT AG, Mainz (DE)

( * ) Notice: Subject to any disclaimer, the term of this patent is extended or adjusted under 35 U.S.C. 154(b) by 626 days.

(21) Appl. No.: 14/690,836

(22) Filed: Apr. 20, 2015

(65) Prior Publication Data

US 2015/0299851 A1    Oct. 22, 2015

Related U.S. Application Data

(63) Continuation of application No. PCT/EP2013/072297, filed on Oct. 24, 2013.

(30) Foreign Application Priority Data

Oct. 24, 2012   (DE) .................... 10 2012 110 131

(51) Int. Cl.
*B32B 3/02* (2006.01)
*B32B 7/00* (2019.01)
(Continued)

(52) U.S. Cl.
CPC ............... *B32B 3/02* (2013.01); *B32B 3/04* (2013.01); *B32B 3/06* (2013.01); *B32B 3/10* (2013.01);
(Continued)

(58) Field of Classification Search
CPC .... B32B 3/02; B32B 3/04; B32B 3/06; B32B 3/10; B32B 3/14; B32B 7/00; B32B 7/02;
(Continued)

(56) References Cited

U.S. PATENT DOCUMENTS

| 4,686,124 A | 8/1987 | Onohara et al. |
| 6,013,337 A | 1/2000 | Knors |

(Continued)

FOREIGN PATENT DOCUMENTS

| DE | 29609958 | 8/1996 |
| DE | 10342401 A1 | 4/2005 |

(Continued)

OTHER PUBLICATIONS

English translation of International Preliminary Report on Patentability dated Apr. 30, 2015 for corresponding PCT/EP2013/072297, 8 pages.

(Continued)

*Primary Examiner* — Walter Aughenbaugh
(74) *Attorney, Agent, or Firm* — Ohlandt, Greeley, Ruggiero & Perle, L.L.P.

(57) ABSTRACT

A composite material for a pharmaceutical packaging is provided that includes a substrate and a protective layer. The substrate has a contact region in contact with the protective layer. The contact region includes a contact area between the substrate and the protective layer and a region of the substrate close to the surface. The substrate is made of glass or of a cyclic olefin polymer or a cyclic olefin copolymer, while the protective layer is made of ceramic material. The substrate in the contact region is different from the substrate outside the contact region.

18 Claims, 3 Drawing Sheets

(51) Int. Cl.

| | |
|---|---|
| *C23C 16/515* | (2006.01) |
| *B32B 3/14* | (2006.01) |
| *B32B 3/06* | (2006.01) |
| *B32B 7/02* | (2019.01) |
| *B32B 3/10* | (2006.01) |
| *B32B 3/04* | (2006.01) |
| *B32B 18/00* | (2006.01) |
| *B32B 9/00* | (2006.01) |
| *C23C 16/30* | (2006.01) |
| *C23C 16/511* | (2006.01) |

(52) U.S. Cl.
CPC ................. *B32B 3/14* (2013.01); *B32B 7/00* (2013.01); *B32B 7/02* (2013.01); *B32B 9/005* (2013.01); *B32B 18/00* (2013.01); *C23C 16/30* (2013.01); *C23C 16/511* (2013.01); *C23C 16/515* (2013.01)

(58) Field of Classification Search
CPC ..... B32B 9/005; B32B 18/00; Y10T 428/131; Y10T 428/1321; Y10T 428/1379; Y10T 428/1383
See application file for complete search history.

(56) References Cited

U.S. PATENT DOCUMENTS

| | | | |
|---|---|---|---|
| 6,156,399 A | 12/2000 | Spallek et al. | |
| 8,343,623 B2 * | 1/2013 | Matsui | B29C 66/72324 156/242 |
| 2010/0247932 A1 | 9/2010 | Jinks et al. | |
| 2013/0171456 A1 | 7/2013 | Fadeev et al. | |

FOREIGN PATENT DOCUMENTS

| | | |
|---|---|---|
| DE | 102005040266 A1 | 3/2007 |
| DE | 69735734 T2 | 4/2007 |
| EP | 0709105 A1 | 5/1996 |
| EP | 0858975 A1 | 8/1998 |
| EP | 0920879 A2 | 6/1999 |

OTHER PUBLICATIONS

Mändl, "Ionenbeschuss von Polymeren far die Medizintechnik" "Ion Bombardment of Polymers for Biomedical Applications", www.vip-journal.de, vol. 22, No. 6, Dec. 2010, with English Summary on p. 2, 5 pages.

International Search Report dated Feb. 11, 2014 for corresponding International Application No. PCT/EP2013/072297.

International Preliminary Report on Patentability dated Mar. 12, 2015 for corresponding International Application No. PCT/EP2013/072297.

Dai, "Processing Techniques for Deposition of Diamond Film and Their Applicaiions", Metallurgical Industry Press, Jun. 2001, pp. 30-31; English translation.

Zhou, "Chemical Vapor Deposition of Diamond Film by Microwave Plasma", China Building Materials Industry Press, Mar. 2002, p. 119; English translation.

Wang, "Growth of Diamond Film and Study on its Applications in Photoelectronic Technology", 2002 Shanghai University Doctoral Dissertation Series, 2002, p. 13; English translation.

Watson, "Film Processing Techniques", China Machine Press, Mar. 1987, p. 293; English translation.

* cited by examiner

COMPOSITE MATERIAL FOR A PHARMACEUTICAL PACKAGING, METHOD FOR THE PRODUCTION THEREOF, AND USE OF THE COMPOSITE MATERIAL

CROSS REFERENCE TO RELATED APPLICATIONS

This application is a continuation of International Application No. PCT/EP2013/072297 filed Oct. 24, 2013, which claims benefit under 35 U.S.C. § 119(a) of German Patent Application No. 10 2012 110 131.0 filed Oct. 24, 2012, the entire contents of both of which are incorporated herein by reference.

BACKGROUND OF THE DISCLOSURE

1. Field of the Invention

The invention relates to a composite material for a pharmaceutical packaging made of a glass or COC or COP substrate to which a protective layer is applied, and to a method for producing such composite material. The invention also relates to a container made of such composite material, and to a use of the composite material for preventing delamination of the substrate and as a barrier.

2. Description of Related Art

When storing liquid products or liquid drug formulations in pharmaceutical packaging, such as vials, ampoules, cartridges, or syringes, the material that comes into contact with the product must meet high standards of chemical resistance. It is especially important that there is no escape of substances from the wall material of the packaging, that could contaminate the product stored therein.

However, packaging made of glass, when used to store or apply products such as phosphate or citrate buffers or salt-containing solutions, are susceptible to glass delamination. In this case, glass flakes may be released.

SUMMARY

The object of the invention is to provide a material for pharmaceutical packaging with improved chemical and mechanical resistance against medical or pharmaceutical products.

This object is achieved in a very surprisingly simple way by the present disclosure. The features of the embodiments may be combined, as far as technically reasonable.

One aspect of the invention relates to a composite material for a pharmaceutical packaging. A pharmaceutical packaging refers to a container, or a vial, or a syringe, or a cartridge, or an ampoule, or a tube.

The composite material may comprise a substrate and a protective layer. The protective layer may be considered as a blocking layer or barrier layer for protecting the substrate and for preventing delamination of the substrate.

The substrate may have a contact region in contact with the protective layer. The contact region may comprise a contact area between the substrate and the protective layer and a region of the substrate close to the surface. Thus, the contact region has a lateral extension along the contact area between the substrate and the protective layer, and a vertical extension in a depth direction of the substrate perpendicular to the contact area between the substrate and the protective layer.

The vertical extension or thickness of the contact region can be at least 0.0001%, at least 0.01%, at least 0.1%, at least 1%, at least 10%, or at least 50% of the substrate thickness. It is also possible that the vertical extension corresponds to the thickness of the substrate.

The lateral extent of the contact region may correspond to an area of at least $2*10-13$%, at least $2*10-11$%, at least $2*10-6$%, at least $2*10-4$%, at least 0.01%, at least 0.1%, at least 1%, at least 10%, at least 40%, or at least 50% of the substrate surface.

The substrate can be made of glass. The substrate may entirely be made of glass, or only that region of the substrate which corresponds to the contact area between the substrate and protective layer can be made of glass.

The constitution of the substrate in the contact region may be different from the constitution of the substrate outside the contact region. Constitution herein refers to the chemical and/or physical properties of the substrate.

The substrate can be provided in form of a flat substrate, such as a glass sheet, or in form of a curved substrate, such as an inner surface of a container.

The protective layer may comprise a ceramic material, that means it can be formed as a ceramic crystalline coating.

It is also possible for the protective layer to be formed as an amorphous coating of the ceramic material, for example an amorphous layer of silicon carbide, oxidized silicon carbide, nitrided silicon carbide, or oxidized nitrided silicon carbide, or silicon nitride, silicon oxynitride, aluminum oxide, aluminum nitride, or aluminum oxynitride, or zirconium oxide, or silicon oxide, i.e. an amorphous quartz layer, as the ceramic material.

Furthermore, the layers may contain hydrogen and may, for example, comprise hydrogenated silicon carbide, hydrogenated silicon oxide, or a hydrogenated form of any of the other compounds listed above.

When storing a liquid product in a glass container, glass delamination may occur during storage, i.e. a partial release of glass flakes.

The protective layer enables to seal the substrate. This advantageously permits to achieve an anti-delamination effect and improved layer resistance, if the container for storing a liquid product is made of the composite material.

The protective layer and its covalent bonding to the surface of the contact region or the inhomogeneous zone is advantageously capable to inhibit diffusion of ions out of the liquid product. This enables to prevent a release of substrate components due to a chemical interaction between the product and the substrate.

Therefore, the composite material has enhanced corrosion resistance as compared to a conventional glass substrate.

Another aspect of the invention relates to a method for producing a composite material that comprises a substrate and a protective layer.

The substrate can be made of glass. The constitution of the substrate in a region close to the surface of the substrate may be different from the constitution of the substrate outside the region close to the surface.

The protective layer can be deposited onto the substrate using a plasma, preferably under decomposition of a disilane precursor. The protective layer can be made of ceramic material.

Another aspect of the invention relates to a combined method for producing the composite material according to the invention.

In one method step, oxygen from the substrate can be transformed into a gas phase by plasma etching.

In another method step, the oxygen can be deposited in the protective layer by plasma deposition.

In a further step, the protective layer can be post-treated following the plasma deposition by being exposed to an oxygen- and/or nitrogen-containing gas mixture.

The combined method allows in a very simple way to introduce nitrogen into the layer surface, thereby simplifying the manufacturing process.

One aspect of the invention relates to a container for a medical or pharmaceutical product. The product may, for example, comprise alkaline drugs, protein-based drugs, or surface active agents, known as surfactants.

At least interiorly the container can be made of the composite material according to the invention.

Another aspect of the invention relates to a use of the composite material according to the invention in a hollow body which is in contact with a liquid product at its inner surface, for preventing delamination of the hollow body or preventing the hollow body from being chemically attacked by the product.

The hollow body can be formed as a tube or a container, such as a pharmaceutical packaging or a vial for the liquid product.

The hollow body may also be configured as a syringe, or a cartridge, or an ampoule for the liquid product. The product may circulate through the hollow body, if the latter is provided in form of a tube. The product can be kept or stored in the hollow body, if the hollow body is configured as a container for the product.

The following modifications and embodiments of the invention may be combined with the aspects of the invention mentioned above.

In one embodiment of the invention, the substrate can be made of glass of hydrolytic class I to V.

In particular, the substrate can be made of borosilicate glass of hydrolytic class I, which advantageously has a better corrosion resistance as compared to other glasses. This advantage may be further enhanced by coating with the protective layer.

The constitution of the substrate in the contact region may refer to a surface roughness. The surface roughness of the substrate in the contact region may be different from the surface roughness of the substrate outside the contact region.

The constitution of the substrate in the contact region may refer to the chemical composition. The chemical composition of the substrate in the contact region may be different from the chemical composition of the substrate outside the contact region.

According to an advantageous embodiment, the contact region may include chemical elements of glass, wherein the composition of the contact region is different from that of the substrate in at least one of the elements. The contact region may preferably include: Si and O; or at least one of Na, B; or at least one of Al, K, Ca, Mg, Ba, Cl.

The constitution of the substrate in the contact region may refer to a surface energy. The surface energy of the substrate in the contact region may be different from the surface energy of the substrate outside the contact region.

The constitution of the substrate in the contact region may refer to a chemical etching rate. The chemical etching rate of the substrate in the contact region may be different from the chemical etching rate of the substrate outside the contact region.

According to one embodiment, the protective layer may be attached to the surface of the substrate by van der Waals forces and/or covalently.

The protective layer may be amorphous, or may optionally be partially crystalline, crystalline, or nano-crystalline. The protective layer may preferably be deposited from the gas phase.

Preferably, the protective layer may have a low density of structural defects such as internal boundary surfaces, pores, or micro-cracks, or only few spatially extended structural defect such as inner boundary surfaces which are oriented perpendicular to the substrate surface and thus provide a short diffusion path for a corrosive attack.

The protective layer may have a wavelength dependent absorptivity, with an extinction coefficient increasing with the wavelength decreasing in a range of wavelengths from 500 nm to 250 nm, wherein the increase is preferably steeper or greater than linear.

This absorption behavior can reduce or prevent transmittance of the substrate to short wavelength light. Given the damaging effect of short wavelength light to drugs, this absorption behavior is very beneficial if the composite material is used in a pharmaceutical packaging, container, syringe, or the like. The absorption behavior mentioned is moreover advantageous in terms of protection against forgery ('anti-counterfeiting').

The refractive index n of the protective layer steadily decreases in a range of wavelengths between 250 nm and 1000 nm, from an initial value $n250\ nm \approx <2.8$ at 250 nm, preferably $n250\ nm \approx <2.5$, to a final value $n1000\ nm > \approx 1.5$ at 1000 nm, preferably $n1000\ nm > \approx 1.6$, more preferably $n1000\ nm > \approx 1.65$. Here, "$n \approx <x$" means that n is approximately x but smaller than x, and "$n > \approx x$" means that n is approximately x but greater than x.

The advantage of an amorphous protective layer vis-à-vis a microcrystalline layer may lie in the fact that the amorphous protective layer has no grain boundaries. Such grain boundaries may form diffusion paths in a corrosive attack caused by diffusion. The gas phase deposition advantageously allows to form layers with a low defect density and an associated high barrier effect.

The protective layer can be free of silicon dioxide $SiO_2$, at least in a sub-region or portion thereof. This can be of particular advantage, since in case of a silicon dioxide layer the silicon oxide network is attacked and dissolved in particular by alkaline solutions. Therefore, a lower proportion of $SiO_2$ is preferable. In particular at the surface of the layer it is preferable to have a layer that differs from a pure $SiO_2$ composition.

The protective layer may include one or more of the following substances or bonds: silicon carbide SiC; hydrogenated oxidized silicon carbide SiC:OH; nitrided oxidized hydrogenated silicon carbide SiC:OHN; nitrogen N; and N—H bonds, or C—N bonds, wherein these bonds may preferably be created by substances including these bonds, or N2 and a hydrogen-containing organic precursor.

An advantage of the nitrogen content in the protective layer is that the substrate becomes more resistant against chemical attack. In addition, surface properties such as the mechanical strength of the layer can be further improved.

The described composition of the protective layer may have an anti-delamination effect, thereby preventing a formation of glass flake-like particles when the composite material comes in contact with a liquid product, for example when the product is stored in a container which is formed from the composite material.

The described composition of the protective layer may furthermore cause resistance to alkaline products such as detergents. This permits preventing an attack on the surface of the substrate as well as a hydrolytic attack on the protective layer.

The composition of the protective layer enables in particular to greatly improve resistance against: acidic and alkaline solutions; alkaline solutions in a range from pH 7 to pH 12; phosphate or citrate buffers; ammonium chloride-ammonia buffer solutions; acetate buffer solutions; solutions containing aminoacetic acid (glycine) or glutaric acid; salt-containing solutions, for example those containing sodium chloride or potassium chloride; iron-containing formulation solutions; components of detergent solutions; or a phosphate-citrate buffer system.

The protective layer may significantly enhance the underlying substrate. For example, a silicon carbide protective layer which is applied on a glass substrate of hydrolytic class II, may achieve a level of glass of hydrolytic class I for the composite material with respect to alkaline leaching.

A silicon carbide-based protective coating has an excellent temperature resistance, for example, above 250° C., 350° C., or 500° C. for more than 30 minutes. This permits a use for sterilization in a heat tunnel or a thermal post-treatment of the coated substrate.

The protective layer may provide for a stable layer functionality or barrier functionality for high temperature applications.

According to one embodiment, the protective layer may comprise two layers. In this case, a first layer can be formed as a base layer, and a second layer can be formed as a surface-near layer.

The second layer may have a composition different from that of the first layer.

The different composition may consist in that the second layer has a different content of nitrogen and/or oxygen and/or carbide than the first layer.

In the second layer, the content of nitrogen and/or oxygen and/or carbon may vary continuously, starting with the content of the first layer, as a function of the distance from the first layer.

The layer structure may: inhibit diffusion of ions; prevent a network attack against the substrate surface and/or a hydrolytic attack against the protective layer; have a protein-repellent and algae-repellent effect; and improve cleanability of the surface due to a high acid and alkali resistance.

The protective layer may have a composition which has proved to be very advantageous. The options for the composition are described below.

The ratio of carbon to silicon may have a value that is referred to as alpha=x/w herein, with:

$Si_{w1}C_{x1}:O_{y1}H_{z1}N_{n1}$=composition of the first layer, and
$Si_{w2}C_{x2}:O_{y2}H_{z2}N_{n2}$=composition of the second layer
wherein
w=amount of substance of Si;
x=amount of substance of C;
y=amount of substance of O;
z=amount of substance of H; and
n=amount of substance of N.

The ratio "alpha" of carbon to silicon may have a value in a range of: 0.8<alpha<7, or 2.5<alpha<5, or 3.1<alpha<5.

The ratio "beta" of nitrogen to silicon may have a value in a range of: 0<beta<3, or 0<beta<0.5, or 0<beta<0.1, with beta=n/w.

The carbon content "c1(C)" in the first layer may have a value of: c1(C)≥40%, or c1(C)≥45%, or c1(C)≥50%, with c1(C)=x1/(w1+x1+y1+z1+n1).

The nitrogen content "c2(N)" in the second layer may have a value of: c2(N)≥0.1%, with c2(N)=n2/(w2+x2+y2+z2+n2).

The nitrogen content "c1(N)" in the first layer may have a value of: c1(N)≥0.01%, or c1(N)≥0.05%, with c1(N)=n1/(w1+x1+y1+z1+n1).

The oxygen content "c2(O)" in the second layer may have a value of: c2(O)≥5%, or c2(O)≥10%, or c2(O)≥15%, with c2(O)=y2/(w2+x2+y2+z2+n2).

The second layer may have a density with respect to nitrogen, oxygen, and/or carbon of: d2>1.7 g/cm3, or d2>1.65 g/cm3.

Each of the features of the composition of the protective layer described contributes to the fact that: the composite material is biocompatible; the composite material is protein-repellent and/or algae-repellent; protein adsorption is smaller as compared to an uncoated glass substrate, preferably by at least 5% or 10%.

The second layer may have a smaller thickness than the first layer.

The protective layer may have a uniformity index "U", with: U>0.5, or U>0.6, or U>0.7. Here, U=Dmin/Dmax, with: Dmin=smallest layer thickness, Dmax=largest layer thickness.

The total thickness "D" of the protective layer can be in a range of: 0.5 nm<D<500 nm, or 1 nm<D<200 nm, or 10 nm<D≤75 nm.

According to one embodiment, the protective layer can be deposited on the substrate using a pulsed microwave CVD plasma. The method has several advantages. The layer so produced is largely free of defects and thus has an improved diffusion barrier effect. If hollow bodies are coated interiorly, a surface-conformal, chemically and physically homogeneous coated inner surface is resulting. The method enables to precisely define the layer thickness in the region of the contact area, so that even a high layer thickness and an associated high barrier effect can be achieved.

According to one embodiment, the composite material may include at least one or a combination of the following materials: aluminum oxide, aluminum nitride, or aluminum oxynitride; zirconium oxide, zirconium nitride, or zirconium oxynitride; titanium oxide, titanium oxynitride, titanium nitride; hydrogenated zirconium oxide, zirconium nitride, or zirconium oxynitride; hydrogenated titanium oxide, titanium oxynitride, titanium nitride; and hydrogenated silicon oxide.

The composite material may include any of the materials mentioned above, with an additional carbon content of: at least 0.1% and at most 30%, or preferably at least 0.5% and at most 25%, or more preferably at least 1% and at most 20%.

Another aspect of the invention relates to a composite material which is preferably usable for a pharmaceutical packaging and which comprises a substrate and a protective layer.

The substrate may have a contact region in contact with the protective layer, which contact region comprises the contact area between the substrate and the protective layer and a region of the substrate close to surface. The substrate may comprise a cyclic olefin polymer or a cyclic olefin copolymer.

The constitution of the substrate in the contact region can be different from the constitution of the substrate outside the contact area.

The protective layer can be made of a ceramic material and may include one or more of the following substances or bonds: silicon carbide SiC; hydrogenated oxidized silicon carbide SiC:OH; nitrided oxidized hydrogenated silicon carbide SiC:OHN; nitrogen; N—H bonds, or C—N bonds.

In conjunction with the substrate made of cyclic olefin polymer or cyclic olefin copolymer, the contact region may include the elements Si and O, or Si, O, C, and H.

Prior to the deposition of the protective layer, the substrate can be preheated, preferably using a plasma process. By preheating the substrate, a lower defect density of the layer can be achieved due to the higher substrate temperature and increased surface diffusion.

On the other hand, this method allows to reduce mechanical stresses to such an extent that the composite of glass substrate and layer becomes extremely temperature resistant. This is due to the fact that elevated temperature loads beyond a critical value may result in cracks or delamination due to thermal stresses associated with the different extension coefficients between layer and substrate.

Before depositing the protective layer, a plasma surface treatment of the glass surface can be performed, thereby achieving a better attachment of the protective layer to the glass substrate.

After the deposition of the protective layer, the coated substrate can be thermally post-treated at a temperature of T>240° C., preferably for a duration of t>3 min. The post-treatment may comprise an exposure of the near-surface region of the protective layer, i.e. the contact region, to an oxygen- and nitrogen-containing gas mixture.

This allow easily to introduce nitrogen into the layer surface.

After the deposition of the protective layer, the coated substrate can be oxidized by first shutting down the plasma and then supplying an oxygen-containing gas for post-nitriding and/or post-oxidizing.

Advantageously, this permits to easily post-nitride or post-oxidize the surface without requiring further energy.

A SiC:OHN protective layer can be deposited by plasma polymerization of a gas mixture with a silane-based precursor, wherein after deposition of the layer a near-surface region is optionally post-treated by being exposed to a nitrogen-containing gas, thereby increasing the content of nitrogen in this region.

According to one embodiment, a gas mixture that includes nitrogen or a nitrogen-containing compound can be used.

In particular, a gas mixture including silane and oxygen can be used.

Nitrogen can be present as an impurity of the starting compounds. The amount of nitrogen can be defined via the content of residual gas.

In a vacuum process, nitrogen can be dosed via a content of residual gas through the leakage rate.

The leakage rate of the residual gas fraction may range from $9*10-1$ to $1.5*10-4$ mba·l/s.

Nitrogen can be introduced into all layers of the protective layer.

Based on the described procedure, the process can be simplified because no additional effort is required for another process gas.

A SiC or SiC:OH protective layer can be deposited under decomposition of a disilane precursor.

A gas including a Si—Si bond or a disilane or a hexamethyldisilane can be used as a precursor.

Pulses with variable pulse durations and/or pulse intervals can be used.

The process temperature can be in a range from: 25° C. to 400° C. or from 30° C. to 300° C.

According to one embodiment, the plasma process can be monitored using a photodetector.

A fragmentation of the Si—Si bond can be monitored by optical inspection selected via a filter.

A substrate temperature can be monitored using a thermal camera.

According to one embodiment, a hollow body whose wall consists of a composite material according to the invention can be used for a variety of liquid products.

Among others, the hollow body can be used for: products including alkaline drugs and/or protein-based drugs; and/or products including surface active agents known as surfactants; and/or non-buffered drug solutions; and/or acidic or neutral or alkaline formulations that include in particular at least one surfactant; and/or solutions in which the surfactant comprises polysorbate, e.g. Tween20, or Tween80, or Pluronics; and/or solutions including sugar or sugar alcohol.

When used in a container that is employed to store non-buffered drug solutions, the composite material prevents a shift of the pH of the stored product out of the allowable tolerance range.

A container with a wall consisting of a composite material according to the invention may advantageously be used in various processes.

Among others, the container can be used in a process which comprises one or more of the following steps: the container is washed before being filled; the container is washed using an aqueous solution that comprises cleaning agents, or detergents; and the container is washed using an acidic or alkaline cleaning agent.

In summary, the protective layer has a large variety of advantageous effects: diffusion barrier against ion exchange between a liquid, preferably aqueous solution and the glass matrix; diffusion barrier against chemical attack on the $SiO_2$ glass network; diffusion barrier for all of the elements of the glass matrix, such as sodium, potassium, silicon, boron, calcium, aluminum, zirconium; resistance to chemical attack in an alkaline pH range; resistance to chemical attack in an acidic and neutral pH range, preferably over the entire pH range from pH 1 to pH 12; and creating a layer morphology with low defect density.

The invention will now be described in more detail based on the illustrated embodiments and with reference to the drawings, wherein the same reference numerals designate the same or equivalent elements. The features of different embodiments can be combined with each other.

DETAILED DESCRIPTION

When storing liquid drug formulations in pharmaceutical packaging made of glass, glass delamination, i.e. a partial release of glass flakes, may occur during storage in conjunction with buffers, such as phosphate and citrate buffers, or salt-containing solutions and other formulation components. Such delamination is a current issue in the pharmaceutical industry, and new cases of glass delamination constantly become known.

Glass delamination can be avoided or at least reduced in a surprisingly simple way, by a coating. On the one hand, the coating prevents a corrosive attack on the glass substrate, and on the other the coating is intrinsically corrosion resistant, thereby preventing a dissolution of the layer even under a chemical attack, for example a hydrolytic attack. In this manner, improved stability of the product in the pharmaceutical packaging is achieved.

Moreover, the coating also provides for a longer shelflife of the container in combination with improved product safety.

In particular, the intension is a reduction of risk for the pharmaceutical industry, and to provide a solution which is effective on various inhomogeneous glass surfaces of glasses of hydrolytic class I, but also glasses of hydrolytic class II to V, and which is applicable for a largest possible variety of buffer solutions and formulation variants.

The composite material 1 can be employed for a large variety of process variations during sterilization or depyrogenation and cleaning of the vials.

Figure 1:
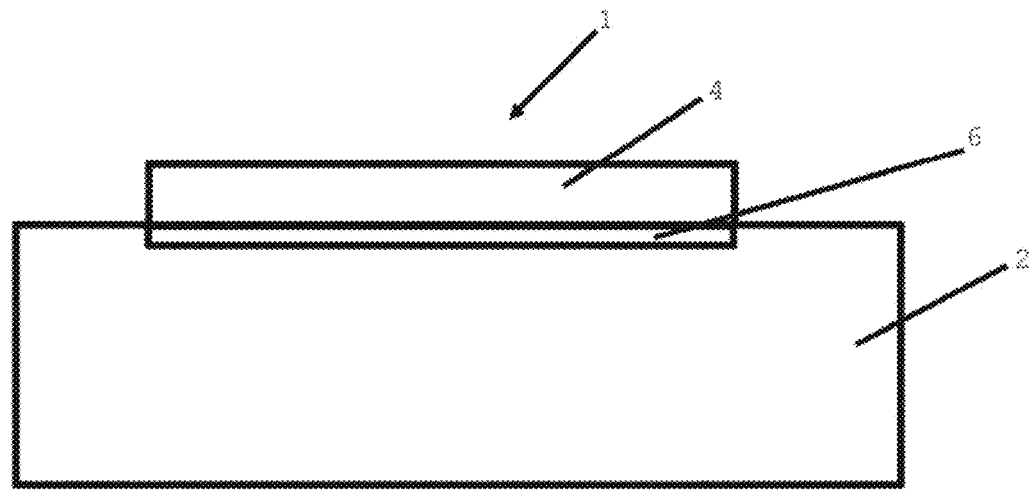
FIG. 1 is a sectional view of a first embodiment of the composite material.

FIG. 1 shows a composite material 1 for pharmaceutical packaging according to a first embodiment. Composite material 1 comprises a substrate 2 and a protective layer 4.

The substrate 2 includes a contact region 6 in contact with the protective layer 4. Contact region 6 comprises the contact area between substrate 2 and protective layer 4, and a region of the substrate 2 close to the surface.

Substrate 2 is made of glass. In the present example, substrate 2 is provided in form of a flat substrate or a glass sheet.

Protective layer 4 is made of ceramic material.

When storing a liquid product in a glass container, glass delamination may occur during storage, i.e. a partial release of glass flakes.

The protective layer advantageously enables to achieve an anti-delamination effect and improved layer resistance, if the container for storing the product is made of the composite material.

Advantageously, the protective layer 4 is covalently attached to the surface of contact region 6.

The protective layer 4 and its covalent attachment to the surface of contact region 6 is advantageously capable to inhibit a diffusion of ions. In this way, a release of substrate components due to a chemical interaction between the product and the substrate 2 can be prevented.

Thus, the composite material 1 has improved corrosion resistance as compared to a conventional glass substrate.

Figure 2:
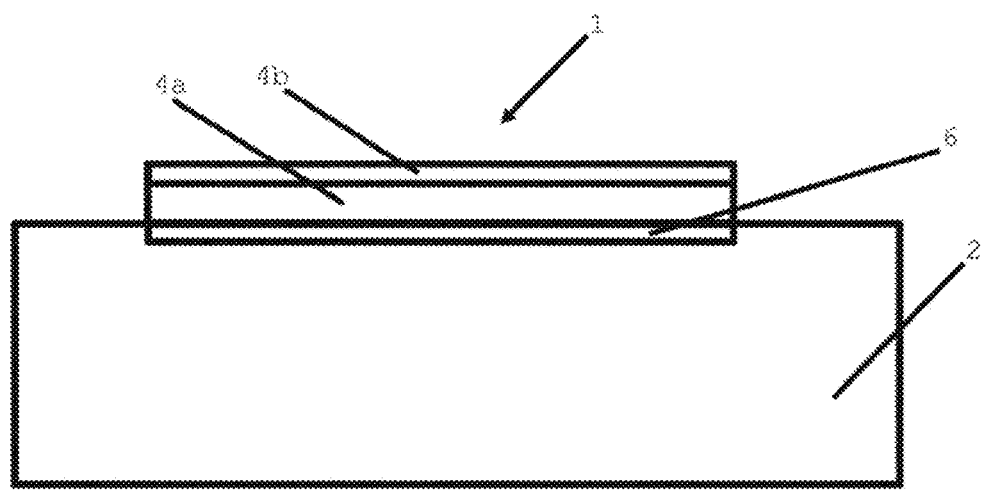
FIG. 2 is a sectional view of a second embodiment of the composite material.

FIG. 2 shows a composite material 1 for pharmaceutical packaging according to a second embodiment. The composite material 1 comprises a substrate 2 and a protective layer 4a, 4b.

In contrast to the first embodiment shown in FIG. 1, the protective layer comprises two sub-layers 4a, 4b. Here, a first layer 4a is formed as a base layer, and a second layer 4b is formed as a near-surface layer.

The second layer 4b has a composition different from that of first layer 4a in that the second layer 4b has a content of nitrogen and/or oxygen and/or carbide different from that of the first layer 4a.

The composite material of the invention may also be used for plastic containers comprising a substrate of cyclic olefin polymer (COP) or cyclic olefin copolymer (COC), such as for vials made of COP or COC, and for COP or COC syringe bodies or cartridge bodies, in order to create a corrosion resistant barrier layer. The inventive coating adheres well to these plastics, with very little or no delamination tendency.

In this case, a layer is deposited on the cyclic olefin polymers, which includes one or more of the following substances or bonds: silicon carbide SiC; hydrogenated oxidized silicon carbide SiC:OH; nitrided oxidized hydrogenated silicon carbide SiC:OHN; nitrogen; and N—H bonds, or C—N bonds.

First Embodiment of the Production Method

Two vials made of borosilicate glass (SCHOTT's Fiolax®) with filling volume of 10 ml and brimful volume of 14 ml are fed into a dual chamber plasma coating reactor and are each placed on a sealing surface at the bottom of the reactor. Then, the reactor chambers are closed, and the interior of the vials is evacuated to a base pressure of <0.1 mbar. The exterior remains at atmospheric pressure throughout the treatment process. While at the lower side in the region of the opening of the vials the connection to the vacuum is maintained, the gas inlet valve is opened and argon is introduced via the gas supply as a first process gas.

Subsequently, using a microwave source, pulsed microwave energy is supplied at a frequency of 2.45 GHz and a plasma is ignited. Through the plasma, the substrate is heated to a temperature above 200° C. Subsequently, during a gas exchange period, a mixture of hexamethyldisilane and argon is introduced, with a concentration of hexamethyldisilane of 5% based on a total flow of 50 sccm, and a process pressure of 0.3 mbar is adjusted, and using the pulsed microwave plasma (average microwave power of 340 W) and a pulse interval of 30 ms, a hydrogenated oxidized nitrided silicon carbide layer of 25 nm thickness is deposited in a coating time of 3 s.

After the coating process, the vials are separated from the vacuum source by a valve, and are purged with nitrogen gas at atmospheric pressure, and are removed from the coating apparatus.

Second Embodiment of the Production Method

Similar to the first embodiment of the production method, two vials of the same size are heated at the beginning of the process, but then, during the gas exchange period, a mixture of hexamethyldisilane, oxygen, and argon is introduced, with a concentration of 35% of hexamethyldisilane, 60% of oxygen, and 5% of argon, based on the total flow, and with the same plasma parameters as in the first embodiment of the production method a hydrogenated oxidized nitrided silicon carbide layer of 50 nm thickness is produced.

Analyzes

After preparation of further coated vials with the same method according to the first and second embodiments of the production method, respectively, function tests were performed on the coated samples and on non-coated references as follows:

1. Determination of sodium leaching after autoclaving for a period of 6 hours at 121° C. with different buffer systems (sealed vials of 12.4 ml filling volume)
2. Determination of silicon leaching after autoclaving for a period of 6 hours at 121° C. with different buffer systems (sealed vials of 12.4 ml filling volume).

The determination of the sodium and silicon release from the inner surface of the coated containers was performed based on ISO 4802-2. For the filling for autoclaving, the following buffer systems were used:

pH 1: HCl c=0.1 mol/L
pH 7: Tris(hydroxymethyl)aminomethane/maleic acid buffer, adjusted to pH 7 using KOH pH 9: Tris(hydroxymethyl)aminomethane buffer, adjusted to pH 9 using HCl.

This results in the values for different samples given in Table 1 below.

TABLE 1

Leaching levels of sodium and silicon after autoclaving (AC; 6 hours at 121° C.) with different buffer systems and pH values

| | Function test | | | | | |
|---|---|---|---|---|---|---|
| Embodiment | AC 6 h 121° C. 0.1M HCl Na [mg/L] | AC 6 h 121° C. 0.1M HCl Si [mg/L] | AC 6 h 121° C. TRIS pH 7 Na [mg/L] | AC 6 h 121° C. TRIS pH 7 Si [mg/L] | AC 6 h 121° C. TRIS pH 9 Na [mg/L] | AC 6 h 121° C. TRIS pH 9 Si [mg/L] |
| Example 1 | 0.04 | 0.16 | 0.00 | 0.07 | 0.01 | 0.06 |
| Example 2 | 0.05 | 0.08 | — | — | 0.03 | 0.05 |
| Reference 10 ml vial | 2.64 | 6.27 | 0.42 | 1.52 | 0.70 | 2.34 |

The test results show that:
1. The layers have a high barrier effect or protective effect against an ion exchange of sodium ions between the Fiolax® glass matrix and the aqueous solutions.
2. The layers also have a high barrier effect against a release of silicon from the glass.
3. The layers are intrinsically resistant to chemical attack. For, if the layers were not stable, elevated amounts of silicon would be released from the silicon carbide containing layer system during an attack on the layer.
4. All statements apply to a wide pH range from pH 1 to pH 9, i.e. the layers both prevent an ion exchange in the acidic pH range and an attack on the glass network in the alkaline pH range.
5. Furthermore, the layers intrinsically have an excellent chemical and in particular hydrolytic resistance in this wide pH range. Especially in the alkaline pH range, the layers are highly resistant against an attack on the network of the layer itself.

Additional samples prepared in accordance with embodiments 1 and 2 of the production method were analyzed using time of flight secondary ion mass spectrometry (TOF-SIMS) analysis (negative ions) and XPS (under 2 tilt angles).

Figure 3:
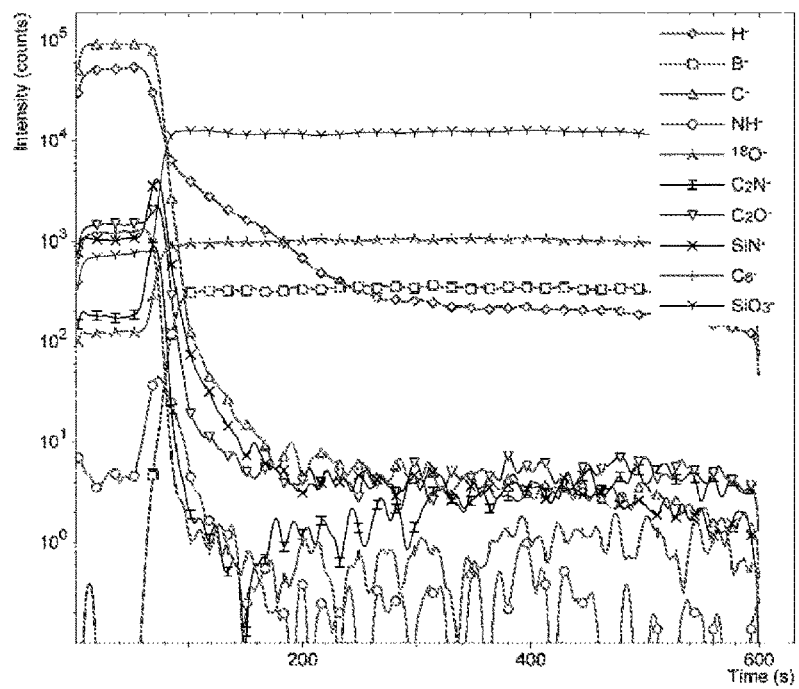
FIG. 3 is an intensity/sputter time profile of a composite material obtained in a first embodiment of the production method, acquired using TOF-SIMS.
Figure 4:
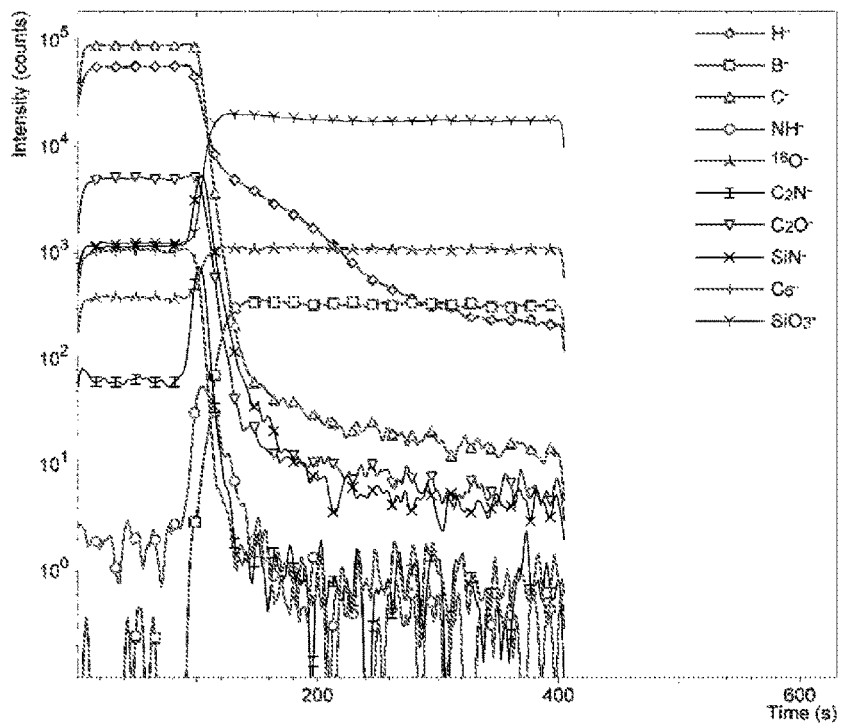
FIG. 4 is an intensity/sputter time profile of a composite material obtained in a second embodiment of the production method, acquired using TOF-SIMS.

The second embodiment of the production method, with the intensity/sputter time profile of FIG. 4 and the XPS analysis of Table 2 under "Example 2", reveals a higher oxygen content than embodiment 1, with the intensity/sputter time profile of FIG. 3 and the XPS analysis according to Table 2 under "Example 1", which is caused by the oxygen supplied as an additional process gas. The lateral curve shape of the intensity/sputter time profiles of FIG. 4 and FIG. 3 prove that the layers of embodiments 1 and 2 of the production method have different thicknesses, which can be seen, inter alia, from the different sputtering durations until the C— signal drops, which indicates the transition from the layer to the substrate.

FIG. 3 shows an intensity/sputter time profile according to the first embodiment of the production method, acquired by TOF-SIMS.

FIG. 4 shows an intensity/sputter time profile according to the second embodiment of the production method, acquired by TOF-SIMS.

TABLE 2

XPS analyses of the first and second embodiments of the production method

| embodiment | Angle (°) | C [at %] | N [at %] | O [at %] | Si [at %] | C/Si | O/Si | N/Si |
|---|---|---|---|---|---|---|---|---|
| Example 1 | 0 | 63.2 | 0.6 | 18.1 | 18.1 | 3.5 | 1.0 | 0.03 |
| | 50 | 63 | 0.4 | 19.5 | 17 | 3.7 | 1.1 | 0.02 |
| Example 2 | 0 | 54.8 | 0 | 26.6 | 18.7 | 2.9 | 1.4 | 0.00 |
| | 50 | 56.2 | 0.1 | 26.5 | 17.3 | 3.2 | 1.5 | 0.01 |

Furthermore, the curve shape and jump of the NH—, SiN—, and C2 N— signals of the intensity/sputter time profiles and, in good agreement therewith, the XPS analyses indicate that small amounts of nitrogen are incorporated into the layers. The nitrogen content is found in the entire range of the intensity/sputter time depth profile that corresponds to the layer. Only when the C— signal for carbon drops, these signals simultaneously drop, in the area of the interface to the substrate.

Third Embodiment of the Production Method

Vials are coated similarly to the embodiments 1 and 2 of the manufacturing process, but previously the vials are preheated to a process temperature using a nitrogen-containing plasma. The coated vials have a good barrier effect against leaching of sodium ions and silicon from the glass, and high layer resistance similar to that of embodiments 1 and 2.

Fourth Embodiment of the Production Method

Glass syringe bodies are coated with a hydrogenated oxidized nitrided silicon carbide layer in a production method similar to that of embodiments 1 and 2, but in a single seat chamber. The coated syringes have a good barrier effect against leaching of sodium ions and silicon from the glass, and a high layer resistance similar to that of embodiments 1 and 2 of the production method.

Layers that were similarly prepared according to the above embodiments were measured with respect to their refractive index and extinction coefficient as a function of wavelength, using ellipsometry.

Figure 5:
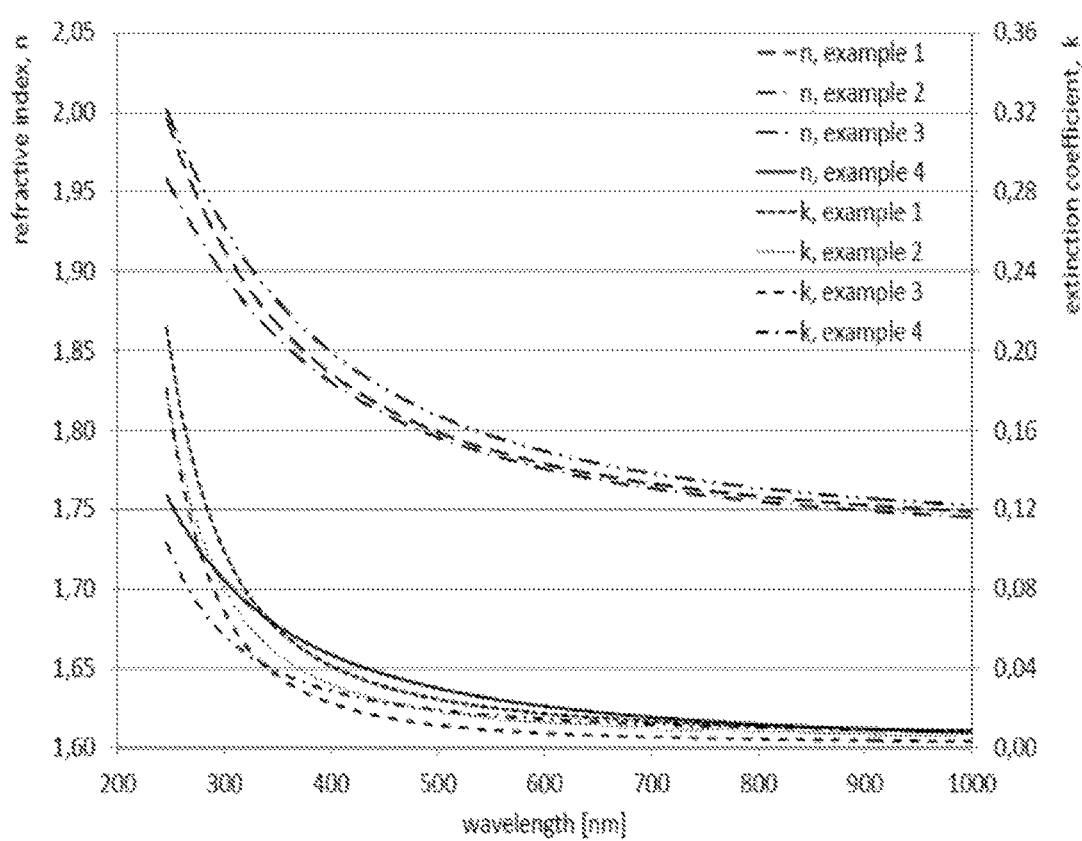
FIG. 5 is a profile of refractive index and extinction coefficient, acquired using ellipsometry.

The determined curve is shown in FIG. 5. The wavelength is plotted on the abscissa axis, the refractive index n is plotted on the left ordinate axis, and the extinction coefficient k is plotted on the right ordinate axis.

As can be seen here, the protective layer has a wavelength-dependent absorptivity, with the extinction coefficient increasing as the wavelength decreases from a wavelength of 500 nm to a wavelength of 250 nm with a slope that is considerably steeper than a linear increase.

REFERENCE NUMERALS

1 Composite material
2 Substrate
4 Protective layer
4a First sub-layer of protective layer
4b Second sub-layer of protective layer
6 Contact region

What is claimed is:

1. A composite material for a pharmaceutical packaging, comprising:
   a substrate; and
   a protective layer comprising hydrogenated oxidized silicon carbide (SiC:OH) and/or nitrided oxidized hydrogenated silicon carbide (SiC:OHN), the substrate has a contact region in contact with the protective layer, the contact region comprising a contact area between the substrate and the protective layer and a region of the substrate, the region of the substrate being defined by a lateral extension along the contact area and a vertical extension in a depth direction perpendicular to the contact area, the substrate being made of a material selected from the group consisting of glass, cyclic olefin polymer, and cyclic olefin copolymer, the protective layer being made of a ceramic material, wherein the substrate in the contact region has a difference from the substrate outside the contact region.

2. The composite material as claimed in claim 1, wherein the material of the substrate is glass selected from the group consisting of hydrolytic class I to V and borosilicate glass of hydrolytic class I.

3. The composite material as claimed in claim 1, wherein the difference of the substrate in the contact region from the substrate outside the contact region is selected from the group consisting of a surface roughness, a chemical composition, a surface energy, and a chemical etching rate.

4. The composite material as claimed in claim 1, wherein the protective layer is attached to the contact area of the substrate by van der Waals forces and/or covalently.

5. The composite material as claimed in claim 1, wherein the protective layer has a structure selected from the group consisting of amorphous, partially crystalline, and crystalline.

6. The composite material as claimed in claim 1, wherein the protective layer is free of silicon dioxide (SiO2), at least in a portion thereof.

7. The composite material as claimed in claim 1, wherein the protective layer comprises a first sub-layer facing the substrate and a second sub-layer facing away from the substrate.

8. The composite material as claimed in claim 7, wherein the second sub-layer has a composition different from that of the first sub-layer.

9. The composite material as claimed in claim 7, further comprising a content of an element selected from the group consisting of nitrogen, oxygen, carbon and combinations thereof of the second sub-layer that is different from that of the first sub-layer.

10. The composite material as claimed in claim 7, wherein the first sub-layer has a carbon content $c1(C)$ of $c1(C) \geq 40\%$ and/or a nitrogen content $c1(N)$ of $c1(N) \geq 0.01\%$, or $c1(N) \geq 0.05\%$.

11. The composite material as claimed in claim 7, wherein the second sub-layer has a nitrogen content $c2(N)$ of $c2(N) \geq 0.1\%$ and/or an oxygen content $c2(O)$ of $c2(O) \geq 5\%$.

12. The composite material as claimed in claim 7, wherein the second sub-layer has a density of an element selected from the group consisting of nitrogen, oxygen, carbon, and combinations thereof of $>1.7$ g/cm3 and/or has a thickness less than a thickness of the first sub-layer.

13. The composite material as claimed in claim 1, wherein the protective layer has a ratio alpha of carbon content to silicon content in a range of $0.8<\text{alpha}<7$ and/or a ratio beta of nitrogen content to silicon content in a range of $0<\text{beta}<3$.

14. The composite material as claimed in claim 1, wherein the composite material is configured for use as a device selected from the group consisting of a container for a medical product, a container for a pharmaceutical product, a hollow tube, a hollow container, a pharmaceutical packaging, a vial, a syringe, a cartridge, and an ampoule, and wherein the protective layer is sufficient to prevent delamination of glass from interaction with a liquid solution.

15. The composite material as claimed in claim 1, wherein the composite material is configured as a hollow body for use with a product selected from the group consisting of products including alkaline based drugs, products including protein-based drugs, products including surface active agents, non-buffered drug solutions, acidic formulations, neutral formulations, alkaline formulations, acidic formulations that include a surface active agent, acidic formulations that include a surfactant, neutral formulations that include a surface active agent, neutral formulations that include a surfactant, alkaline formulations that include a surface active agent, alkaline formulations that include a surfactant, solutions with polysorbate, solutions including sugar, and solutions including sugar alcohol.

16. A composite material for a pharmaceutical packaging, comprising:
   a substrate; and
   a protective layer, the substrate has a contact region in contact with the protective layer, the contact region comprising a contact area between the substrate and the protective layer and a region of the substrate, the region of the substrate being defined by a lateral extension along the contact area and a vertical extension in a depth direction perpendicular to the contact area, the substrate being made of a material selected from the group consisting of glass, cyclic olefin polymer, and cyclic olefin copolymer, the protective layer being made of a ceramic material, wherein the substrate in the contact region has a difference from the substrate outside the contact region, wherein the protective layer comprises a first sub-layer facing the substrate and a second sub-layer facing away from the substrate, and wherein the second sub-layer has a content that varies continuously as a function of a distance from the first sub-layer.

17. The composite material as claimed in claim 16, wherein the content of the second sub-layer that is in contact with the first sub-layer is the same as a content of the first sub-layer.

18. A composite material for a pharmaceutical packaging, comprising:
   a substrate; and
   a protective layer, the substrate has a contact region in contact with the protective layer, the contact region comprising a contact area between the substrate and the protective layer and a region of the substrate, the region of the substrate being defined by a lateral extension along the contact area and a vertical extension in a depth direction perpendicular to the contact area, the substrate being made of a material selected from the group consisting of glass, cyclic olefin polymer, and cyclic olefin copolymer, the protective layer being a ceramic crystalline coating, wherein the substrate in the contact region comprises, but the substrate outside the contact region does not comprise, a chemical element of glass selected from a group consisting of Na, B, Al, K, Ca, Mg, Ba, Cl, a combination of Si and O, and any combinations thereof.

* * * * *